US008882430B2

(12) United States Patent
Yazawa et al.

(10) Patent No.: US 8,882,430 B2
(45) Date of Patent: Nov. 11, 2014

(54) INDUSTRIAL ROBOT

(75) Inventors: Takayuki Yazawa, Nagano (JP); Hiroto Nakajima, Nagano (JP)

(73) Assignee: Nidec Sankyo Corporation (JP)

( * ) Notice: Subject to any disclaimer, the term of this patent is extended or adjusted under 35 U.S.C. 154(b) by 1124 days.

(21) Appl. No.: 12/675,807

(22) PCT Filed: Aug. 27, 2008

(86) PCT No.: PCT/JP2008/002319
§ 371 (c)(1),
(2), (4) Date: Jul. 7, 2010

(87) PCT Pub. No.: WO2009/028178
PCT Pub. Date: Mar. 5, 2009

(65) Prior Publication Data
US 2010/0284770 A1    Nov. 11, 2010

(30) Foreign Application Priority Data

Aug. 31, 2007 (JP) ................................. 2007-225687

(51) Int. Cl.
*B25J 9/04* (2006.01)
*H01L 21/677* (2006.01)

(52) U.S. Cl.
CPC . *B25J 9/042* (2013.01); *B25J 9/043* (2013.01); *H01L 21/67742* (2013.01)
USPC ................... 414/222.01; 414/744.5

(58) Field of Classification Search
CPC ............. B25J 9/04; B25J 9/041; B25J 9/042; B25J 9/047; B25J 9/10; B25J 9/106; B25J 9/1065; B25J 9/107; H01L 21/677; H01L 21/6773; H01L 21/67739; H01L 21/67742

USPC ............... 414/225.01, 226.01, 226.05, 744.1, 414/744.2, 744.3, 744.4, 744.5, 744.6
See application file for complete search history.

(56) References Cited

U.S. PATENT DOCUMENTS 6,102,649 A  *  8/2000  Ogawa et al. ............... 414/744.5
6,315,512 B1 *  11/2001 Tabrizi et al. ................. 414/217

(Continued)

FOREIGN PATENT DOCUMENTS

| JP | 4-258148 A | 9/1992 |
| JP | 7-142552 A | 6/1995 |
| JP | 7-171778 A | 7/1995 |
| JP | 10-163296 A | 6/1998 |

(Continued)

OTHER PUBLICATIONS

International Search Report for International Application Na PCT/JP2008/002319 mailed Nov. 11, 2008 with English Translation.

*Primary Examiner* — Saul Rodriguez
*Assistant Examiner* — Brendan Tighe
(74) *Attorney, Agent, or Firm* — Cantor Colburn LLP

(57) ABSTRACT

An industrial robot may include a first hand and a second hand on which an object is mounted, a first arm which turnably holds the first hand on a first end side, a second arm which turnably holds the second hand on a first end side, a common arm which turnably holds a second end side of the first arm and a second end side of the second arm, a first turning center part which is a turning center of the first arm with respect to the common arm, a second turning center part which is a turning center of the second arm with respect to the common arm, and a main body part which turnably holds the common arm. The first hand and the second hand may be disposed so as to superpose each other, and the first hand and the second hand may be formed with an escape part.

8 Claims, 8 Drawing Sheets

(56) References Cited

U.S. PATENT DOCUMENTS

| | | |
|---|---|---|
| 6,568,552 B1 * | 5/2003 | Tabrizi et al. ............... 220/260 |
| 6,647,665 B1 * | 11/2003 | Tabrizi et al. ................ 49/340 |
| 2001/0004852 A1 | 6/2001 | Mitsuyoshi |
| 2003/0029479 A1 * | 2/2003 | Asano ......................... 134/18 |
| 2004/0091349 A1 | 5/2004 | Tabrizi et al. |
| 2007/0166135 A1 * | 7/2007 | Koike ......................... 414/217 |
| 2008/0199283 A1 * | 8/2008 | Mitsuyoshi ............. 414/222.01 |

FOREIGN PATENT DOCUMENTS

| | | |
|---|---|---|
| JP | 11-325102 A | 11/1999 |
| JP | 2001-185596 A | 7/2001 |
| JP | 2002-504744 A | 2/2002 |
| JP | 2002-222845 A | 8/2002 |
| JP | 2002-299413 A | 10/2002 |
| JP | 2008198884 A * | 8/2008 |
| KR | 2001-0062622 A | 7/2001 |
| WO | 99/28951 A2 | 6/1999 |

* cited by examiner

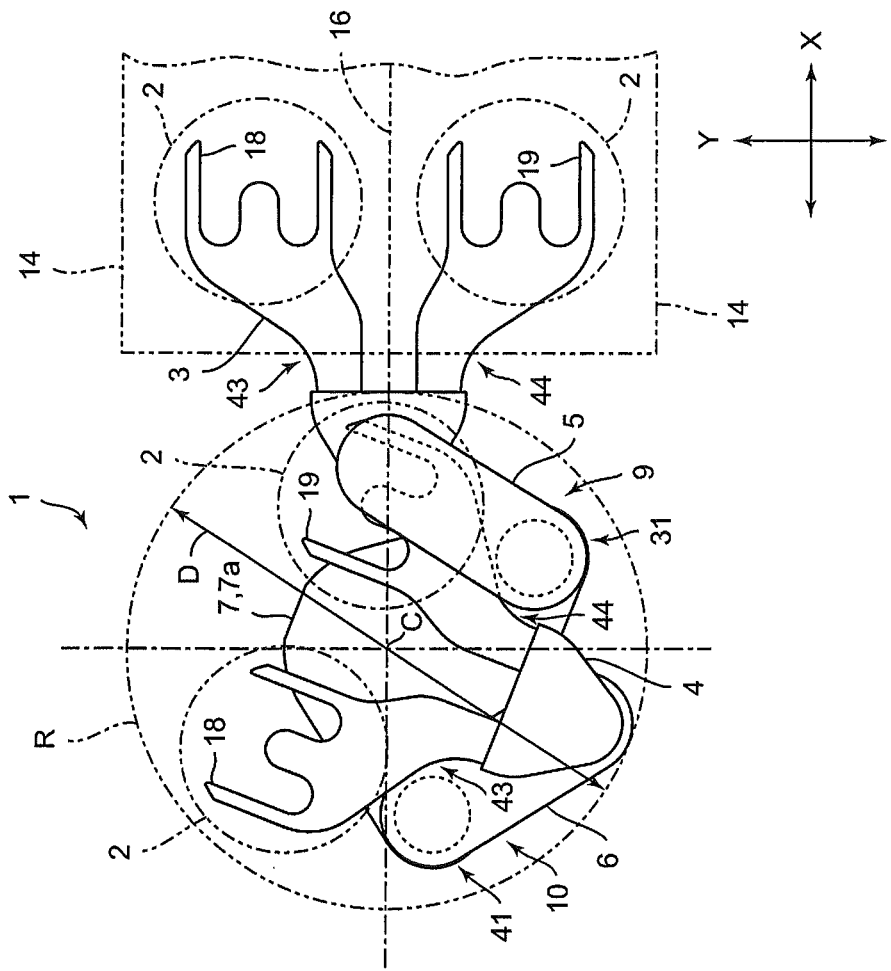
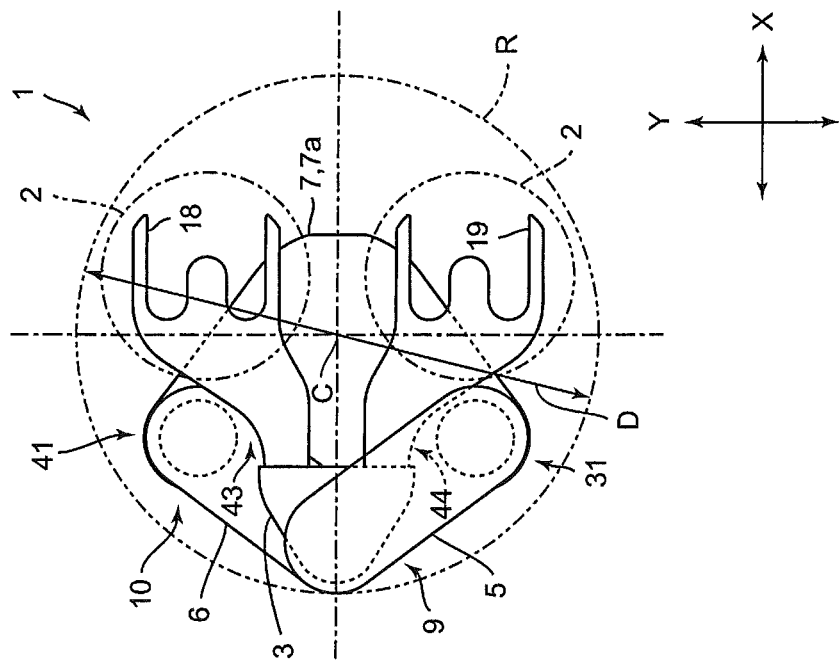
Fig. 8(A)
Fig. 8(B)

INDUSTRIAL ROBOT

CROSS REFERENCE TO RELATED APPLICATIONS

This is a U.S. national stage of application No. PCT/JP2008/002319, filed on Aug. 27, 2008. Priority under 35 U.S.C. §119(a) and 35 U.S.C. §365(b) is claimed from Japanese Application No. 2007-225687, filed Aug. 31, 2007, the disclosure of which is also incorporated herein by reference.

FIELD OF THE INVENTION

The present invention related to an industrial robot for conveying an object to be conveyed.

BACKGROUND

Conventionally, an industrial robot has been widely utilized for carrying out an object to be conveyed from a storage part where the object to be conveyed is accommodated and for carrying an object to be conveyed into the storage part. As this type of an industrial robot, a substrate conveying robot has been known which carries out a substrate such as a semiconductor wafer that is an object to be conveyed from a vacuum chamber as a storage part and which carries a substrate into the vacuum chamber (see, for example, Patent References 1 and 2).

The substrate conveying robot which is described in the Patent Reference 1 includes a first arm which is formed in a substantially "L"-shape and whose vertex portion is turnably held by a drive box in which a drive part is disposed, a second arm and a third arm whose one end sides are respectively turnably held at both ends of the first arm, and substrate holding parts (hand) which are turnably held at the other end sides of the second arm and the third arm.

The substrate conveying robot is provided with three motors for individually driving the first through the third arms. The first through the third arms are turned with respect to the drive box in a state where a turning center of a hand for the second arm and a turning center of a hand for the third arm are superposed each other. Therefore, the substrate conveying robot is capable of decreasing its turning diameter. The substrate conveying robot is structured so that only one piece of substrate is mounted on one hand, and only one piece of substrate is conveyed by a single carrying-in operation or a single carrying-out operation.

Further, a substrate conveying robot described in Patent Reference 2 is structured roughly similar to the substrate conveying robot described in Patent Reference 1.

[Patent Reference 1] Japanese Patent Laid-Open No. Hei 10-163296

[Patent Reference 2] Japanese Patent Laid-Open No. Hei 7-171778

In recent years, in order to improve productivity, an industrial robot has been required to convey a plurality of substrates by a single carrying-in operation or carrying-out operation. However, the substrate conveying robot described in Patent Reference 1 or 2 is structured so that only one piece of substrate is conveyed by a single carrying-in operation or carrying-out operation. In other words, Patent Reference 1 or 2 does not disclose a specific structure of an industrial robot which is capable of conveying a plurality of substrates by a single carrying-in operation or carrying-out operation while decreasing its turning diameter.

SUMMARY OF THE INVENTION

In view of the problem described above, at least an embodiment of an industrial robot is capable of conveying a plurality of objects to be conveyed by a single carrying-in operation or carrying-out operation while decreasing its turning diameter.

In order to solve the problem, at least an embodiment of the present invention provides an industrial robot for performing carrying-out of an object to be conveyed from a storage part where the object to be conveyed is accommodated and carrying-in of an object to be conveyed to the storage part, the industrial robot including a first hand and a second hand on which a plurality of objects to be conveyed is mounted, a first arm which turnably holds the first hand on its one end side, and a second arm which turnably holds the second hand on its one end side, a common arm which turnably holds the other end side of the first arm and the other end side of the second arm, a first turning center part which is a turning center of the first arm with respect to the common arm, and a second turning center part which is a turning center of the second arm with respect to the common arm, and a main body part which turnably holds the common arm. In a waiting state of the first hand and the second hand where the first arm and the second arm are contracted with respect to the main body part, the first hand and the second hand are disposed so as to superpose each other, and the first hand and the second hand are formed with an escape part for preventing interference with the first turning center part and the second turning center part at a time of a turning operation.

The industrial robot in accordance with at least an embodiment of the present invention is provided with the first hand, which is held on one end side of the first arm whose the other end side is held by the common arm, and the second hand which is held on one end side of the second arm whose the other end side is held by the common arm, and the first hand and the second hand are disposed so as to superpose each other in a waiting state of the first hand and the second hand. Therefore, according to at least an embodiment of the present invention, a turning diameter of the common arm, the first arm, the second arm and the like (in other words, a turning diameter of the industrial robot) can be made smaller by means of that drive sources are provided for individually driving the common arm, the first arm and the second arm, and that a turning operation of the industrial robot is performed in the waiting state of the first hand and the second hand.

Further, the industrial robot in accordance with at least an embodiment of the present invention is provided with the first hand and the second hand for mounting a plurality of objects to be conveyed, and the first hand and the second hand are formed with an escape part for preventing from interference with the first turning center part and the second turning center part at the time of a turning operation. Therefore, even when the sizes of the first hand and the second hand are set to be larger in order to convey a plurality of objects to be conveyed in a single carrying-in operation or a single carrying-out operation, the first hand and the second hand can be operated without a problem. As a result, according to at least an embodiment of the present invention, a plurality of objects to be conveyed can be conveyed in a single carrying-in operation or a single carrying-out operation.

In at least an embodiment of the embodiment of the present invention, it is preferable that the common arm is formed in a roughly triangular shape when viewed in an axial direction of a turning center of the first arm or the second arm with respect to the common arm, and the first turning center part and the second turning center part are respectively disposed in the vicinities of different angular parts of the common arm. According to this structure, while enhancing rigidity of the common arm, the first arm and the second arm can be disposed in a well balanced manner with respect to the common arm.

In the embodiment of the present invention, it is preferable that the first hand and the second hand are closely faced to each other in the waiting state. According to this structure, the industrial robot can be made thinner.

In the embodiment of the present invention, it is preferable that the first hand and the second hand are provided with a first mounting part and a second mounting part, on each of which one piece of the object to be conveyed is mounted, and a fixing part to which a base end side of the first mounting part and a base end side of the second mounting part are fixed, and the first mounting part and the second mounting part are fixed to the fixing part in a separated state with a predetermined distance in an orthogonal direction which is perpendicular to a conveying direction of the object to be conveyed, and the escape part is formed on outer sides of the first mounting part and the second mounting part in the orthogonal direction. According to this structure, the first mounting part and the second mounting part are fixed to the fixing part in the separated state with a predetermined distance in the orthogonal direction and thus, even when a partition wall is formed between a storage part where an object to be conveyed mounted (or to be mounted) on the first mounting part is accommodated and a storage part where an object to be conveyed mounted (or to be mounted) on the second mounting part is accommodated, carrying-out or carrying-in of an object to be conveyed can be appropriately performed.

Further, in order to solve the problem, at least an embodiment of the present invention provides an industrial robot for performing carrying-out of an object to be conveyed from a storage part in which the object to be conveyed is accommodated and carrying-in of an object to be conveyed to the storage part, the industrial robot including a first hand and a second hand on which a plurality of objects to be conveyed is mounted, a first arm which turnably holds the first hand on its one end side, and a second arm which turnably holds the second hand on its one end side, a common arm which turnably holds the other end side of the first arm and the other end side of the second arm, a first turning center part which is a turning center of the first arm with respect to the common arm, and a second turning center part which is a turning center of the second arm with respect to the common arm, and a main body part which turnably holds the common arm. In a waiting state of the first hand and the second hand where the first arm and the second arm are contracted with respect to the main body part, the first hand and the second hand are disposed so as to superpose each other from an upper side in this order and, the second hand is formed with an escape part for preventing interference with the first turning center part at a time of a turning operation.

The industrial robot in accordance with at least an embodiment of the present invention is provided with the first hand, which is held on one end side of the first arm whose the other end side is held by the common arm, and the second hand which is held on one end side of the second arm whose the other end side is held by the common arm, and the first hand and the second hand are disposed so as to superpose each other in a waiting state of the first hand and the second hand. Therefore, in at least an embodiment of the present invention, a turning diameter of the common arm, the first arm, the second arm and the like can be made smaller by means of that drive sources are provided for individually driving the common arm, the first arm and the second arm, and that a turning operation of the industrial robot is performed in the waiting state of the first hand and the second hand.

Further, the industrial robot in accordance with at least an embodiment of the present invention is provided with the first hand and the second hand on which a plurality of objects to be conveyed is mounted, and the first hand and the second hand are disposed so as to superpose each other from an upper side in this order. Further, the second hand disposed on the lower side is formed with an escape part for preventing interference with the first turning center part at a time of a turning operation. Therefore, even when the sizes of the first hand and the second hand are set to be larger in order to convey a plurality of objects to be conveyed in a single carrying-in operation or a single carrying-out operation, the first hand and the second hand can be operated without a problem. As a result, according to at least an embodiment of the present invention, a plurality of objects to be conveyed can be conveyed in a single carrying-in operation or a single carrying-out operation.

As described above, in the industrial robot in accordance with at least an embodiment of the present invention, a plurality of objects to be conveyed can be conveyed in a single carrying-in operation or a single carrying-out operation while decreasing the turning diameter.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 8(A) and 8(B) are explanatory views showing an operation of the industrial robot shown in FIG. 1. FIG. 8(A) shows a home position returned state of the industrial robot and FIG. 8(B) shows a state at the time of an expanding operation of a first arm part of the industrial robot.

DETAILED DESCRIPTION OF PREFERRED EMBODIMENTS

Embodiments of the present invention will be described below with reference to the accompanying drawings.
(Schematic Structure of Industrial Robot)

Figure 1:
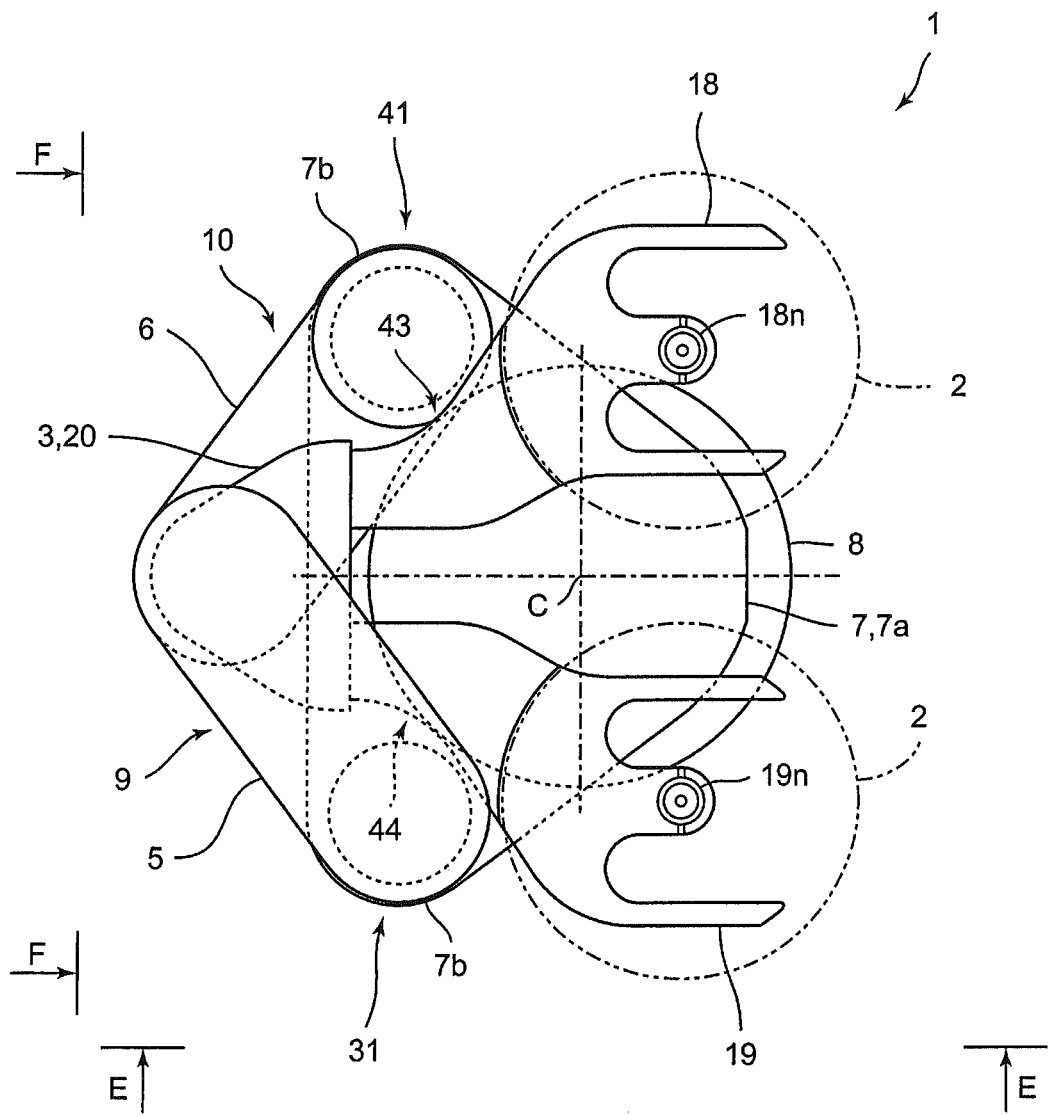
FIG. 1 is a plan view showing an industrial robot in accordance with an embodiment of the present invention.
Figure 2:
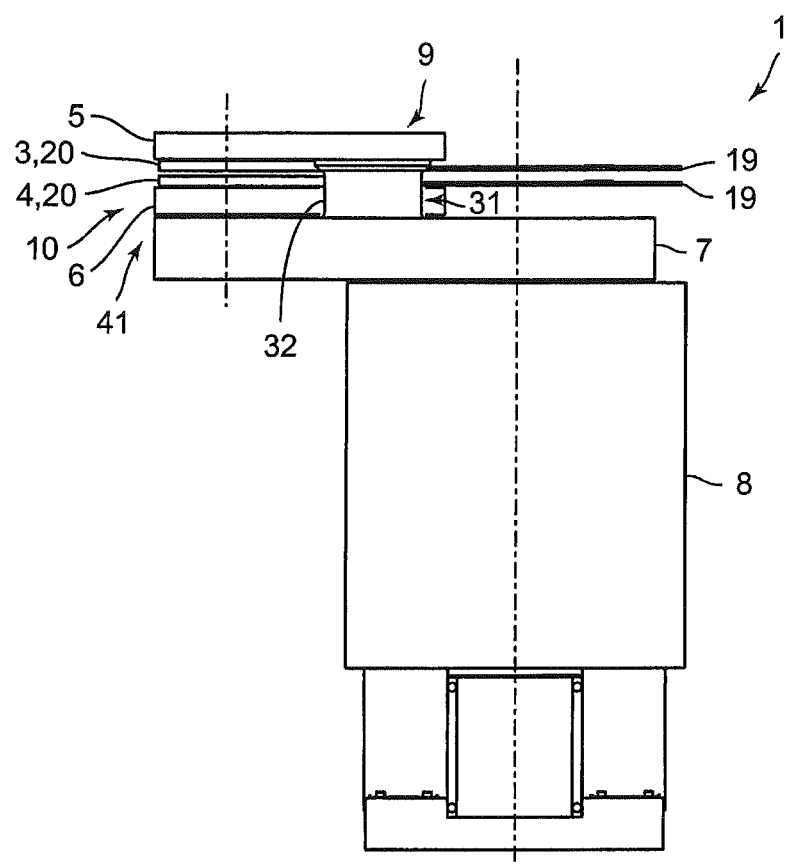
FIG. 2 is a side view showing the industrial robot which is viewed in the "E-E" direction in FIG. 1.
Figure 3:
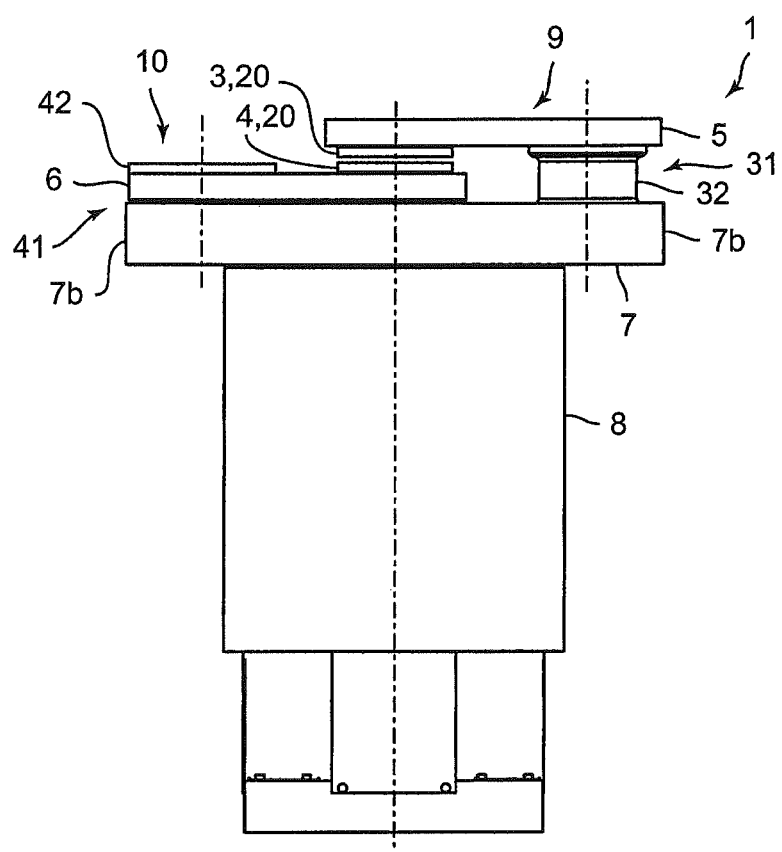
FIG. 3 is a side view showing the industrial robot which is viewed in the "F-F" direction in FIG. 1.
Figure 4:
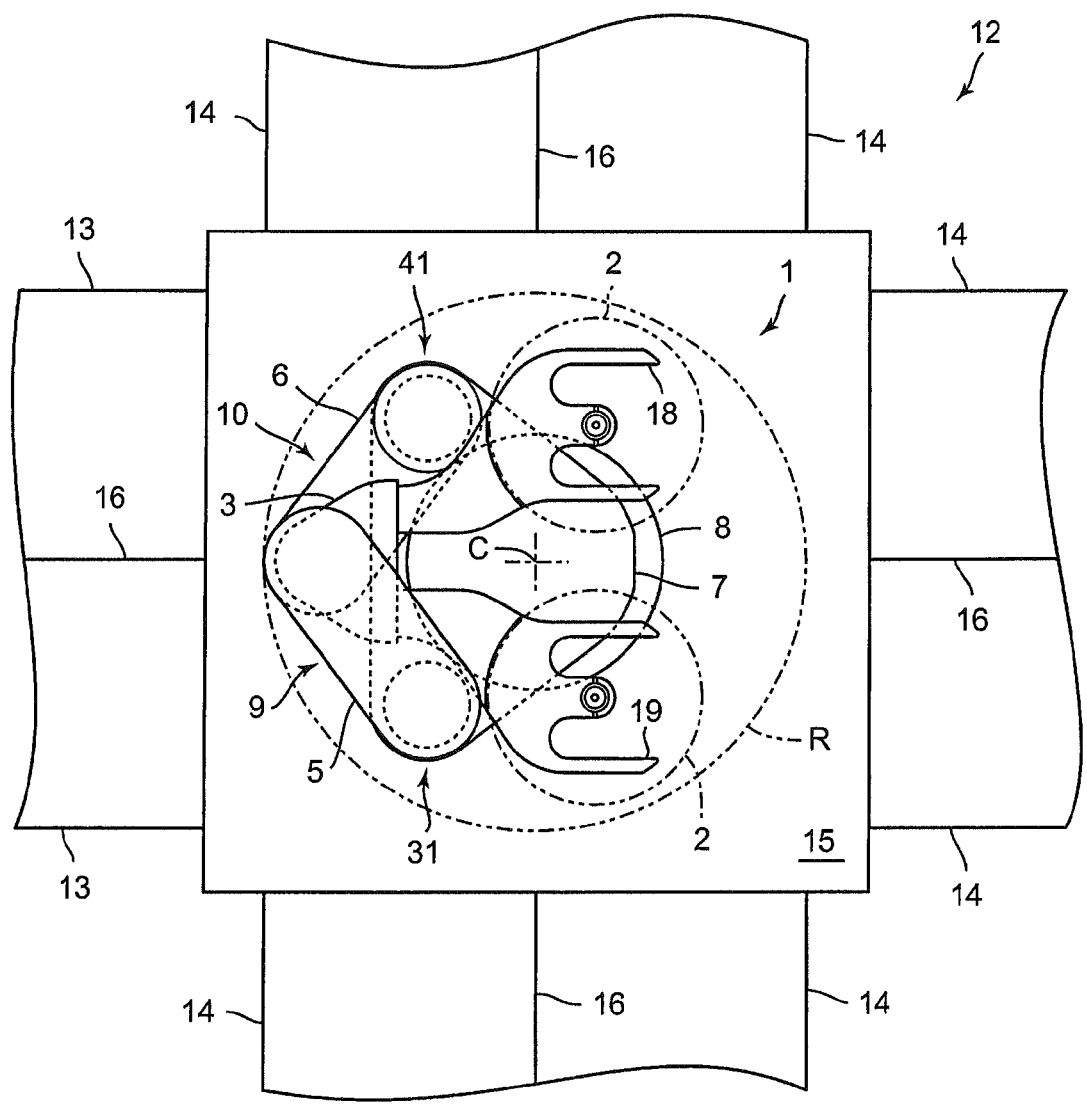
FIG. 4 is a plan view showing a schematic structure of a semiconductor manufacturing system in which the industrial robot shown in FIG. 1 is installed.
Figure 5:
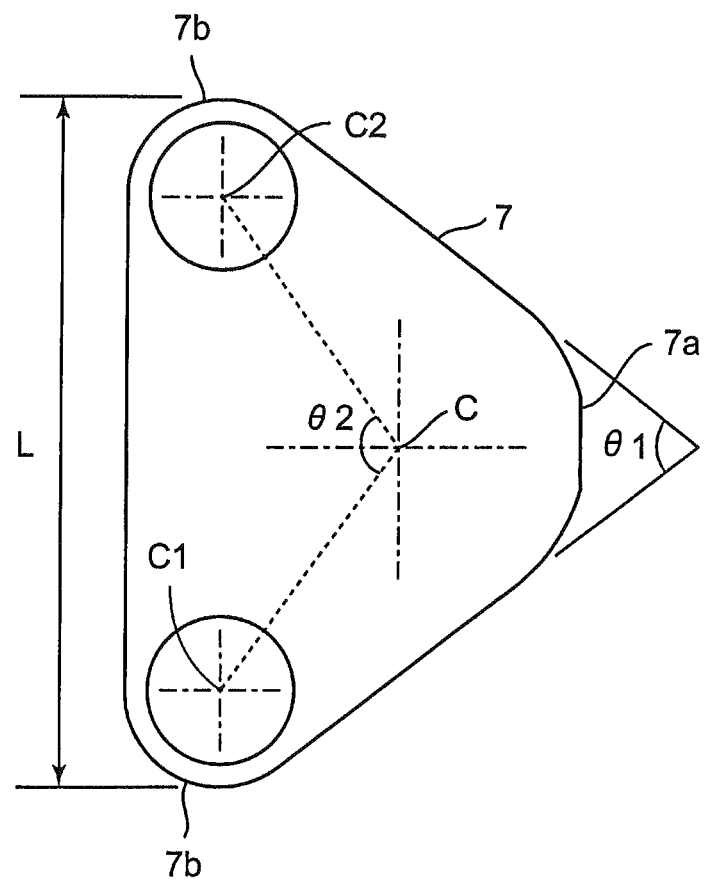
FIG. 5 is a plan view showing a common arm in FIG. 1.
Figure 6:
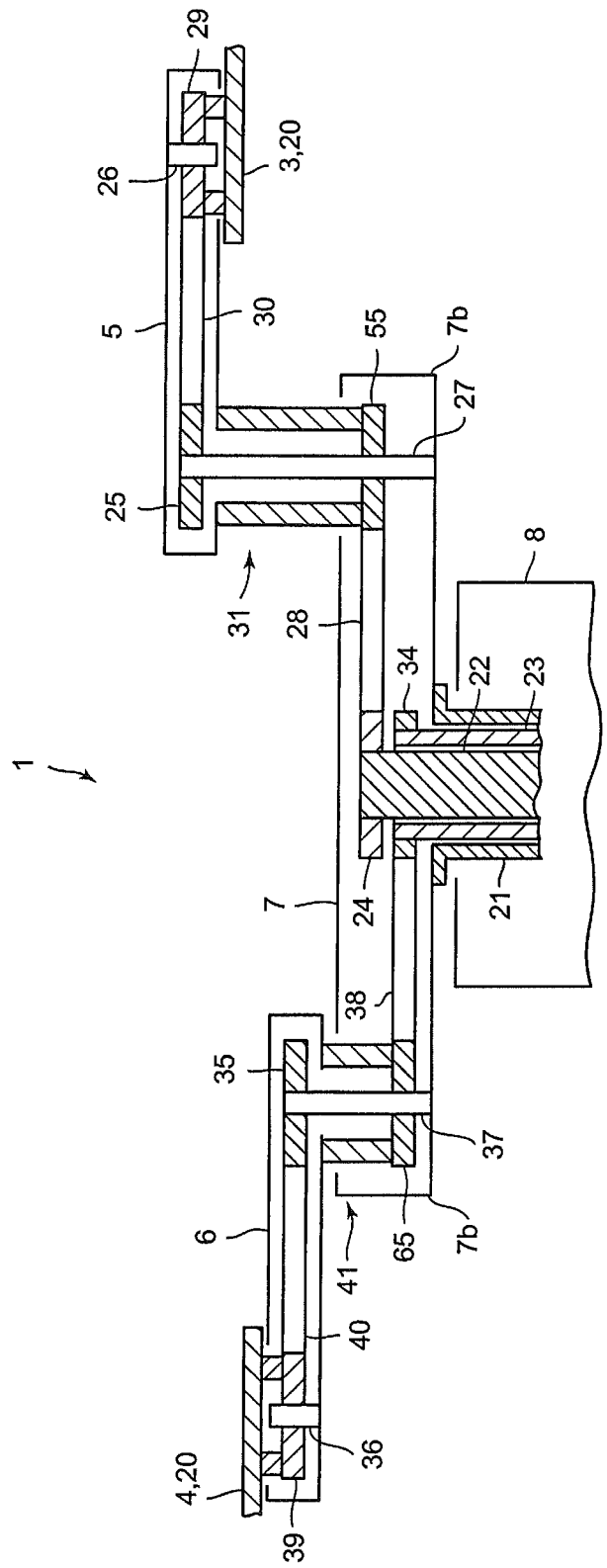
FIG. 6 is an explanatory schematic view showing a schematic structure of a power transmission mechanism of the industrial robot shown in FIG. 1.

FIG. 1 is a plan view showing an industrial robot 1 in accordance with an embodiment of the present invention. FIG. 2 is a side view showing the industrial robot 1 which is viewed in the "E-E" direction in FIG. 1. FIG. 3 is a side view showing the industrial robot 1 which is viewed in the "F-F" direction in FIG. 1. FIG. 4 is a plan view showing a schematic structure of a semiconductor manufacturing system 12 in which the industrial robot 1 shown in FIG. 1 is installed. FIG. 5 is a plan view showing a common arm 7 in FIG. 1. FIG. 6 is an explanatory schematic view showing a schematic structure of a power transmission mechanism of the industrial robot 1 shown in FIG. 1.

An industrial robot 1 in this embodiment (hereinafter, referred to as a "robot 1") is a robot for conveying a semiconductor wafer 2 formed in a thin disk-like shape which is an object to be conveyed (hereinafter, referred to as a "wafer 2"). The robot 1 includes, as shown in FIGS. 1 through 3, a first hand 3 on which two pieces of wafer 2 are mounted or temporarily held to be conveyed, a second hand 4 on two pieces of wafer 2 are mounted or temporarily held to be conveyed, a first arm 5 which turnably holds the first hand 3 on its tip end side (one end side or first end side), a second arm 6 which turnably holds the second hand 4 on its tip end side (one end side or first end side), a common arm 7 which turnably holds a base end side (the other end side or second end side) of the first arm 5 and a base end side (the other end side or second end side) of the second arm 6, and a main body part 8 which turnably holds the common arm 7. In this embodiment, the first arm part 9 is structured of the first arm 5 and the common arm 7, and the second arm part 10 is structured of the second arm 6 and the common arm 7. In FIG. 3, a part of the first hand 3 and a part of the second hand 4 are not shown.

Further, the robot 1 in this embodiment is installed and used, for example, in a semiconductor manufacturing system 12 as shown in FIG. 4. Specifically, the robot 1 is installed and used in the semiconductor manufacturing system 12 which includes delivery chambers 13 for delivering a wafer 2 between the semiconductor manufacturing system 12 and an external device (not shown), processing chambers 14 for performing a predetermined processing on the wafer 2, and a conveying chamber 15 where the robot 1 is installed.

As shown in FIG. 4, in the semiconductor manufacturing system 12, the conveying chamber 15 is formed in a substantially rectangular parallelepiped shape. For example, two delivery chambers 13 are adjacently disposed on a single side face of the conveying chamber 15 and, for example, two processing chambers 14 are adjacently disposed on each of three other side faces of the conveying chamber 15. A partition wall 16 is formed between the adjacent delivery chambers 13 and between the adjacent processing chambers 14. Further, a gate (not shown) for carrying in and out a wafer 2 is disposed between the delivery chamber 13 or the processing chamber 14 and the conveying chamber 15.

The robot 1 which is disposed in the conveying chamber 15 carries out a wafer 2 from the delivery chamber 13 or the processing chamber 14 and carries in a wafer 2 to the delivery chamber 13 or the processing chamber 14. In other words, the first arm part 9 and the second arm part 10 are expanded and contracted with respect to the main body part 8 to carry in and out a wafer 2 to and from the delivery chamber 13 and the processing chamber 14.

Specifically, when a wafer 2 is to be carried in, the first arm part 9 or the second arm part 10 which has been contracted is expanded and the first hand 3 or the second hand 4 is entered into the delivery chamber 13 or the processing chamber 14 through the gate. Further, when a wafer 2 is to be carried out, the first arm part 9 or the first arm part 10 which has been entered and expanded into the delivery chamber 13 or the processing chamber 14 is contracted and the first hand 3 or the second hand 4 is returned within the conveying chamber 15 through the gate.

In this embodiment, a pressure within the delivery chamber 13, a pressure within the processing chamber 14 and a pressure within the conveying chamber 15 are set to be an atmospheric pressure. In other words, the robot 1 in this embodiment is used under an atmospheric pressure. Further, in this embodiment, the delivery chamber 13 and the processing chamber 14 are a storage part where wafers 2, i.e., objects to be conveyed are accommodated.

The first hand 3 and the second hand 4 are provided with a first mounting part 18 and a second mounting part 19 for respectively mounting one piece of wafer 2, and a fixing part 20 to which a base end side of the first mounting part 18 and a base end side of the second mounting part 19 are fixed. Detailed structures of the first hand 3 and the second hand 4 will be described below.

The first arm 5 and the second arm 6 are, as shown in FIG. 1, formed such that their shapes when viewed in an upper and lower direction (perpendicular direction to the paper face of FIG. 1 and the upper and lower direction in FIGS. 2 and 3) are like an athletic track. Further, the first arm 5 and the second arm 6 are formed in a hollowed shape.

The common arm 7 is formed such that its shape when viewed in the upper and lower direction (in other words, an axial direction of a turning center of the first arm 5 or the second arm 6 with respect to the common arm 7) is roughly a triangle. Specifically, as shown in FIG. 5, the common arm 7 is formed such that its shape viewed in the upper and lower direction is roughly an isosceles triangle. In this embodiment, an apex part 7a and portions corresponding to two angular parts 7b except the apex part 7a are formed in a substantially curved face shape. Further, the common arm 7 is formed in a hollowed shape. In addition, an angle θ1 of the apex part 7a (see FIG. 5) is about 75°. Further, when the center of the first turning center part 31 which is the turning center of the first arm 5 with respect to the common arm 7 is set to be the center "C1" and, when the center of the second turning center part 41 which is the turning center of the second arm 6 with respect to the common arm 7 is set to be the center "C2", an angle θ2 (see FIG. 5) defined by a line connected of the center "C1" with the turning center "C" of the common arm 7 and by a line connected of the center "C2" with the turning center "C" is set to be about 106°.

As described above, the base end side of the first hand 3 is turnably connected with the tip end side of the first arm 5, and the base end side of the second hand 4 is turnably connected with the tip end side of the second arm 6. Further, the base end sides of the first arm 5 and the second arm 6 are turnably connected with the common arm 7. Specifically, the first arm 5 and the second arm 6 are respectively turnably connected with the common arm 7 in the vicinities of two angular parts 7b (see FIG. 5). The common arm 7 is turnably connected with the main body part 8. Specifically, the common arm 7 is turnably connected with the main body part 8 at a position a little nearer to the apex part 7a than the center position of the common arm 7 when viewed in the upper and lower direction (see the turning center "C" in FIG. 5). Further, the first arm 5, the first hand 3, the second hand 4, the second arm 6, the common arm 7 and the main body part 8 are disposed from the upper side in this order in the upper and lower direction.

The main body part 8 is formed such that its outward shape is a substantially cylindrical shape. The main body part 8 includes, as shown in FIG. 6, a solid rotation shaft 22 which is disposed at a center part in a radial direction, a first hollow rotation shaft 23 which is concentrically disposed with the solid rotation shaft 22 so as to cover an outer peripheral face of the solid rotation shaft 22, a second hollow rotation shaft 21 which is concentrically disposed with the solid rotation shaft 22 so as to cover an outer peripheral face of the first hollow rotation shaft 23, three drive motors (not shown) for respectively turning the solid rotation shaft 22, the first hollow rotation shaft 23 and the second emptiness rotation shaft 21, and an elevating and lowering mechanism (not shown) for elevating and lowering the solid rotation shaft 22, the first hollow rotation shaft 23 and the second hollow rotation shaft 21 together.

The second hollow rotation shaft 21, the solid rotation shaft 22 and the first hollow rotation shaft 23 are relatively turnable to each other. In this embodiment, the second hollow rotation shaft 21 functions to turn the common arm 7 with respect to the main body part 8, the solid rotation shaft 22 functions to turn the first arm 5 with respect to the main body part 8 and the common arm 7, and the first hollow rotation shaft 23 functions to turn the second arm 6 with respect to the main body part 8 and the common arm 7.

The common arm 7 is fixed on the upper end of the second hollow rotation shaft 21. Specifically, the common arm 7 is fixed on the upper end of the second hollow rotation shaft 21 so that a shaft center of the second hollow rotation shaft 21 is coincided with the turning center "C". Further, an upper end of the solid rotation shaft 22 and an upper end of the first hollow rotation shaft 23 are disposed in the inside of the common arm 7.

A pulley 24 disposed in the inside of the common arm 7 is fixed to the upper end of the solid rotation shaft 22. A pulley 55 is fixed to a bottom face on the base end side of the first arm 5, and a fixed shaft 26 is fixed in the inside on the tip end side of the first arm 5. Further, a fixed shaft 27 is fixed in the vicinity of one angular part 7b in the inside of the common arm 7. A pulley 25 disposed in the inside of the first arm 5 is fixed to an upper end of the fixed shaft 27. The pulley 55 is disposed in the inside of the common arm 7. The fixed shaft 27 is passed through the pulley 55, and the pulley 55 is capable of turning around the fixed shaft 27. A belt 28 is stretched between the pulley 24 and the pulley 55.

A pulley 29 is fixed to an upper face on the base end side of the first hand 3. The pulley 29 is disposed in the inside on the tip end of the first arm 5. A fixed shaft 26 is passed through the pulley 29, and the pulley 29 is capable of turning around the fixed shaft 26. A belt 30 is stretched between the pulley 29 and the pulley 25.

In this embodiment, the first turning center part 31, which is the turning center of the first arm 5 with respect to the common arm 7, is structured of the pulleys 25 and 55, the fixed shaft 27 and the like. The first turning center part 31 is, as shown in FIG. 3, provided with a cover member 32 for covering a connecting part of the pulley 55 with the first arm 5 and the cover member 32 is disposed in the vicinity of one of the angular parts 7b of the common arm 7. In FIG. 6, the cover member 32 is not shown.

A pulley 34 disposed in the inside of the common arm 7 is fixed to an upper end of the first hollow rotation shaft 23. A power transmission mechanism from the pulley 34 to the second hand 4 is structured so as to be substantially similar to the power transmission mechanism from the pulley 24 to the first hand 3. In other words, a fixed shaft 37, which is fixed in the inside of the common arm 7 in the vicinity of the other of the angular parts 7b, is passed through the pulley 65 fixed on a bottom face on the base end side of the second arm 6, and the pulley 65 is capable of turning around the fixed shaft 37. The pulley 65 is disposed in the inside of the common arm 7. Further, a pulley 35 disposed in the inside of the second arm 6 is fixed to an upper end of the fixed shaft 37. A belt 38 is stretched between the pulley 65 and the pulley 34. Further, a bottom face on a base end side of the second hand 4 is fixed with a pulley 39 which is disposed in the inside on a tip end side of the second arm 6. A fixed shaft 36 fixed in the inside on the tip end side of the second arm 6 is passed through the pulley 39, and the pulley 39 is capable of turning around the fixed shaft 36. A belt 40 is stretched between the pulley 35 and the pulley 39.

In this embodiment, the second turning center part 41 which is a turning center of the second arm 6 with respect to the common arm 7 is structured of the pulleys 35 and 65, the fixed shaft 37 and the like. The second turning center part 41 is, as shown in FIG. 3, provided with a cover member 42 for covering an upper face side of the second arm 6 and the cover member 42 is disposed in the vicinity of the other of the angular parts 7b of the common arm 7. In FIG. 6, the cover member 42 is not shown.

In this embodiment, a pitch between the pulleys 24 and 25, a pitch between the pulley 25 and 29, a pitch between the pulleys 34 and 35, and a pitch between the pulleys 35 and 39 are set to be equal to each other. Further, a ratio of a diameter of the pulley 24 and a diameter of the second pulley part 25b, and a ratio of a diameter of the pulley 34 and a diameter of the second pulley part 35b are set to be 2:1, and a ratio of a diameter of the first pulley part 25a and a diameter of the pulley 29, and a ratio of a diameter of the first pulley part 35a and a diameter of the pulley 39 are set to be 1:2.

Therefore, in this embodiment, at the time of an expanding/contracting operation which will be described later, although an angle between the first hand 3 and the first arm 5, and an angle between the first arm 5 and the common arm 7 are varied, the first hand 3 moves along a virtual straight line, which is defined by connecting the center of the pulley 24 (in other words, the center of the main body part 8) with the center of the pulley 29 (in other words, the turning center of the first hand 3), in a state where its direction is unchanged. Similarly, at the time of an expanding/contracting operation, although an angle between the second hand 4 and the second arm 6, and an angle between the second arm 6 and the common arm 7 are varied, the second hand 4 moves along a virtual straight line, which is defined by connecting the center of the pulley 34 with the center of the pulley 39, in a state where its direction is unchanged.

(Structures of First Hand and Second Hand)

Figure 7:
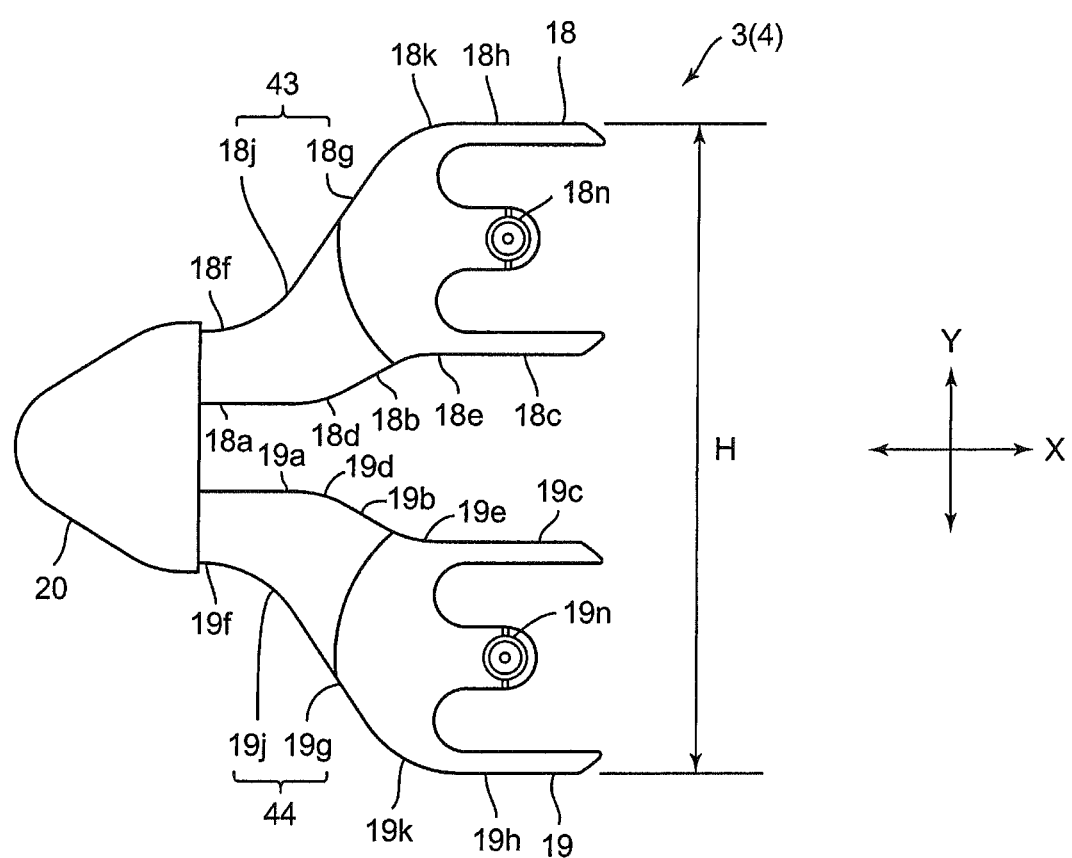
FIG. 7 is a plan view showing a first hand in FIG. 1.

FIG. 7 is a plan view showing the first hand 3 in FIG. 1.

The first hand 3 and the second hand 4 are, as described above, provided with a first mounting part 18 and a second mounting part 19, and a fixing part 20. The first hand 3 and the second hand 4 are formed so that a width on its base end side is set to be narrower than that on its tip end side (in other words, its base end side is narrowed), and the first hand 3 and the second hand 4 are formed in a roughly "T"-shape as a whole. As shown in FIG. 7, the first mounting part 18 and the second mounting part 19 are fixed to the fixing part 20 in a separated state where they are separated from each other with a predetermined distance. Specifically, the first mounting part 18 and the second mounting part 19 are fixed to the fixing part 20 in a separated state where they are separated from each other with a predetermined distance in an orthogonal direction "Y" (upper and lower direction in FIG. 7), which is perpendicular to a conveying direction "X" (lateral direction in FIG. 7) of a wafer 2 that is a direction of the virtual straight line.

The first mounting part 18 is a thin plate-shaped member and, for example, it is formed of ceramic. A wafer 2 is mounted on a tip end side of the first mounting part 18. Further, as shown in FIG. 7, a width on the tip end side of the first mounting part 18 in the orthogonal direction "Y" is set to be wider than a width on its base end side.

Specifically, when viewed in the upper and lower direction (direction perpendicular to the paper surface of FIG. 7), an inner side of the first mounting part 18 in the orthogonal direction "Y" is structured of a straight part 18a parallel to the conveying direction "X", an inclined part 18b inclined toward an outer side in the orthogonal direction "Y", and a straight part 18c parallel to the conveying direction "X". The straight part 18a, the inclined part 18b and the straight part 18c are formed from the base end side to the tip end side in this order. The straight part 18a and the inclined part 18b are smoothly connected with each other through a circular arc part 18d and the inclined part 18b and the straight part 18c are smoothly connected with each other through a circular arc part 18e.

On the other hand, when viewed in the upper and lower direction, an outer side of the first mounting part 18 in the orthogonal direction "Y" is structured of a straight part 18f parallel to the conveying direction "X", an inclined part 18g inclined at a sharper or larger angle than the inclined part 18b toward the outer side in the orthogonal direction "Y", and a straight part 18h parallel to the conveying direction "X". The straight part 18f, the inclined part 18g and the straight part 18h are formed from the base end side to the tip end side in this order. The straight part 18h and the inclined part 18g are smoothly connected with each other through a circular arc part 18j and the inclined part 18g and the straight part 18h are smoothly connected with each other through a circular arc part 18k.

In this embodiment, the inclined part 18g and the circular arc part 18j are formed as an escape part 43 for preventing an interference of the first hand 3 with the second turning center part 41 at the time of turning of the first hand 3 with respect to the first arm 5. Similarly, the inclined part 18g and the circular arc part 18j are formed as an escape part 43 for preventing an interference of the second hand 4 with the second turning center part 41 at the time of turning of the second hand 4 with respect to the second arm 6.

Further, the tip end side of the first mounting part 18 (between the straight part 18c and the straight part 18h) is formed in a roughly "E" shape. Further, in this embodiment, as shown in FIG. 7, a sucking part 18n for sucking a wafer 2 is formed at the tip end side of the first mounting part 18. Specifically, the sucking part 18n is formed so that the center of a wafer 2 mounted on the first mounting part 18 and the sucking part 18n are substantially coincided with each other.

The second mounting part 19 is formed similarly to the first mounting part 18 and fixed to the fixing part 20 so as to be symmetrically disposed to the first mounting part 18 with respect to the center line of the fixing part 20 in the orthogonal direction "Y". Therefore, a detailed description of the second mounting part 19 is omitted. In this embodiment, a straight part 19a, an inclined part 19b, a straight part 19c, circular arc parts 19d and 19e, a straight part 19f, an inclined part 19g, a straight part 19h, circular arc parts 19j and 19k, and a sucking part 19n of the second mounting part 19 respectively correspond to the straight part 18a, the inclined part 18b, the straight part 18c, the circular arc parts 18d and 18e, the straight part 18f, the inclined part 18g, the straight part 18h, the circular arc parts 18j and 18k, and the sucking part 18n of the first mounting part 18.

Further, in this embodiment, the inclined part 19g and the circular arc part 19j are formed as an escape part 44 for preventing an interference of the first hand 3 with the first turning center part 31 at the time of turning of the first hand 3 with respect to the first arm 5. Similarly, the inclined part 19g and the circular arc part 19j are formed as an escape part 44 for preventing an interference of the second hand 4 with the first turning center part 31 at the time of turning of the second hand 4 with respect to the second arm 6.

The fixing part 20 is formed in a roughly triangular shape and is structured as a base end side portion of the first hand 3 or the second hand 4. In the first hand 3, the pulley 29 is fixed to an upper face of the fixing part 20. Further, in the second hand 4, the pulley 39 is fixed to a bottom face of the fixing part 20.

In this embodiment, a width "H" in the orthogonal direction "Y" of the first hand 3 and the second hand 4 (distance between the straight part 18h and the straight part 19h) (see FIG. 7) is substantially equal to a distance "L" between the two angular parts 7b (see FIG. 5).

(Schematic Operation of Robot)

FIGS. 8(A) and 8(B) are explanatory views showing a schematic operation of the robot 1 shown in FIG. 1. FIG. 8(A) shows a home position returned state of the robot 1 and FIG. 8(B) shows a state at a time of an expanding operation of the first arm part 9 of the robot 1.

In this embodiment, as shown in FIG. 8(A), a state where the first arm part 9 and the second arm part 10 are contracted is an initial state (home position returned state) of the robot 1. In other words, the home position returned state where the first arm 5 and the second arm 6 are contracted with respect to the main body part 8 is a waiting state of the first hand 3 and the second hand 4.

In the home position returned state, the first hand 3 and the second hand 4 are disposed so as to superpose each other in the upper and lower direction. Specifically, in the home position returned state, as shown in FIG. 8(A), an under face of the first hand 3 and an upper face of the second hand 4 are closely faced each other in a state that the first arm 5 and the second arm 6 are disposed symmetrically at the center line of the robot 1 in the orthogonal direction "Y". Further, in this state, the first hand 3 and the second hand 4 are superposed each other in the upper and lower direction so that an outward shape of the first hand 3 and an outward shape of the second hand 4 are substantially coincided with each other.

In addition, in this state, two angular parts 7b of the common arm 7 are disposed symmetrically at the center line of the robot 1 in the orthogonal direction "Y". In other words, superposed portions on the base end side of the first hand 3 and on the base end side of the second hand 4, the turning center "C", and the apex part 7a are disposed in this order on the center line of the robot 1 in the orthogonal direction "Y". In the home position returned state, the tip end of the first arm 5 and the tip end of the second arm 6 are disposed at remotest positions from the turning center "C".

Further, in this embodiment, when the drive motor for the second hollow rotation shaft 21, the drive motor for the solid rotation shaft 22, and the drive motor for the first hollow rotation shaft 23 are rotated so that the second hollow rotation shaft 21, the solid rotation shaft 22 and the first hollow rotation shaft 23 are turned by the same turning angles at the same turning speeds, the common arm 7 is relatively turned with respect to the main body part 8 with the turning center "C" as a turning center under a state where relative positions of the first hand 3 and the second hand 4 to the main body part 8 are unchanged (in other words, under a state where the first arm part 9 and the second arm part 10 are not expanded and contracted with respect to the main body part 8). In other words, when the second hollow rotation shaft 21, the solid rotation shaft 22 and the first hollow rotation shaft 23 are turned by the same turning angles at the same turning speeds by the drive motors, the robot 1 performs a turning operation.

In this case, the robot 1 performs a turning operation under the home position returned state. Therefore, the tip end of the first arm 5 and the tip end of the second arm 6 are moved along a virtual circle "R" whose center is the turning center "C". Further, the maximum diameter "D" (turning diameter) of the robot 1 at the time of a turning operation is, as shown in FIG. 8(A), two times of a distance between the tip end of the first arm 5 and the tip end of the second arm 6 and the turning center "C".

On the other hand, under a state where the drive motor for the solid rotation shaft 22 is stopped, when the drive motor for the second hollow rotation shaft 21 and the drive motor for the first hollow rotation shaft 23 are rotated so that the second hollow rotation shaft 21 and the first hollow rotation shaft 23 are turned by the same turning angles at the same turning speeds, the first arm part 9 is expanded and contracted with respect to the main body part 8. In other words, as shown in FIG. 8(B), under a state where the solid rotation shaft 22 is stopped, when the second hollow rotation shaft 21 and the first hollow rotation shaft 23 are turned by the same turning angles at the same turning speeds, the robot 1 performs an expanding/contracting operation for the first arm part 9.

The first hand 3 is formed with the escape parts 43 and 44 and thus, at the time of an expanding/contracting operation, the first hand 3 is moved smoothly without interfering with the first turning center part 31 and the second turning center part 41. Further, at this time of an expanding/contracting operation, the second hand 4 and the second arm 6 are turned together with the common arm 7 under a state where their relative positions to the common arm 7 are maintained. In this embodiment, in a state where the first arm part 9 is extended so that the first hand 3 is entered into the delivery chamber 13 or the processing chamber 14, as shown in FIG. 8(B), the partition wall 16 is disposed between the first mounting part 18 and the second mounting part 19.

Similarly, under a state where the drive motor for the first hollow rotation shaft 23 is stopped, when the drive motor for the second hollow rotation shaft 21 and the drive motor for the solid rotation shaft 22 are rotated so that the second hollow rotation shaft 21 and the solid rotation shaft 22 are turned by the same turning angles at the same turning speeds, the second arm part 10 is expanded and contracted with respect to the main body part 8. In other words, under a state where the first hollow rotation shaft 23 is stopped, when the second hollow rotation shaft 21 and the solid rotation shaft 22 are turned by the same turning angles at the same turning speeds, the robot 1 performs an expanding/contracting operation for the second arm part 10. At the time of this expanding/contracting operation, the first hand 3 and the first arm 5 are turned together with the common arm 7 under a state where their relative positions to the common arm 7 are maintained.

In order to obtain the robot 1 in the home position returned state (in order to return the robot 1 to the home position) at the time of assembling and the like, the robot 1 in this embodiment is provided with a first proximity sensor (not shown) for detecting a relative turning position of the solid rotation shaft 22 with respect to the second hollow rotation shaft 21 and a second proximity sensor (not shown) for detecting a relative turning position of the first hollow rotation shaft 23 with respect to the second hollow rotation shaft 21. The first proximity sensor is turned in an "ON" state when the first arm part 9 is contracted, and the second proximity sensor is turned in an "ON" state when the second arm part 10 is contracted.

In this embodiment, when one of the first proximity sensor and the second proximity sensor is in an "ON" state, one of the first arm part 9 and the second arm part 10 is extended and the other is contracted, which is estimated as an appropriate state that is capable of returning to the home position and a returning operation of the robot 1 to the home position is performed. On the other hand, when both of the first proximity sensor and the second proximity sensor are in "OFF" states, the states of the first arm part 9 and the second arm part 10 are not known, which is estimated to be unable to return to the home position and thus, after one of the first proximity sensor and the second proximity sensor is returned to an "ON" state by an individual operation, the robot 1 is returned to the home position.

(Principal Effects in this Embodiment)

As described above, the robot 1 in this embodiment is provided with the first hand 3, which is held on one end side of the first arm 5 whose the other end side is held by the common arm 7, and the second hand 4 which is held on one end side of the second arm 6 whose the other end side is held by the common arm 7. Further, the first hand 3 and the second hand 4 are disposed so as to superpose each other at the time of turning operation of the robot 1. Therefore, the turning diameter "D" of the robot 1 can be made smaller.

Further, the robot 1 is provided with the first hand 3 and the second hand 4 for respectively mounting two pieces of wafer 2. In addition, the first hand 3 and the second hand 4 are formed with the escape parts 43 and 44 for preventing from interference with the first turning center part 31 and the second turning center part 41 at the time of expanding/contracting operation. Therefore, even when the sizes of the first hand 3 and the second hand 4 are set to be larger in order to convey two pieces of wafer 2 in a single carrying-in operation or a single carrying-out operation, the first hand 3 and the second hand 4 can be operated smoothly. As a result, in this embodiment, two pieces of wafer 2 can be adequately conveyed in a single carrying-in operation or a single carrying-out operation.

In this embodiment, the common arm 7 is formed in a roughly triangular shape when viewed in the upper and lower direction, and the first turning center part 31 and the second turning center part 41 are respectively disposed in the vicinities of different angular parts 7b of the common arm 7. Therefore, while enhancing rigidity of the common arm 7, the first arm 5 and the second arm 6 can be disposed in a well balanced manner with respect to the common arm 7.

In this embodiment, in the home position returned state, the first hand 3 and the second hand 4 are closely faced to each other. Therefore, the robot 1 can be made thinner.

In this embodiment, the first mounting part 18 and the second mounting part 19 are fixed to the fixing part 20 in the separated state with a predetermined distance therebetween in the orthogonal direction "Y". Therefore, even when the partition wall 16 is formed between two adjacent delivery chambers 13 or between two adjacent processing chambers 14, a carrying-out operation or a carrying-in operation of wafers 2 is simultaneously and appropriately performed from or to two delivery chambers 13 or two processing chambers 14.

(Other Embodiments)

Although the present invention has been shown and described with reference to a specific embodiment, various changes and modifications will be apparent to those skilled in the art from the teachings herein.

In the embodiment described above, the escape parts 43 and 44 are formed in both of the first hand 3 and the second hand 4. However, the present invention is not limited to this embodiment. For example, when the first hand 3 and the second turning center part 41 are not interfered with each other, the first hand 3 may be formed with only the escape part 44. Further, when the first hand 3 is disposed on an upper side of the first arm 5 and the first hand 3 does not interfere with the first turning center part 31 and the second turning center part 41, only the second hand 4 may be formed with the escape parts 43 and 44. In addition, when the second hand 4 and the second turning center part 41 are not interfered with each other, the second hand 4 may be formed with only the escape part 44. Even in these cases, while decreasing the turning diameter, a plurality of wafers 2 can be conveyed in a single carrying-in operation or a single carrying-out operation.

In the embodiment described above, two pieces of wafer 2 can be mounted on each of the first hand 3 and the second hand 4. However, the present invention is not limited to this embodiment. For example, the first hand 3 and the second hand 4 may be structured so as to be capable of mounting two or more pieces of wafer 2.

In the embodiment described above, the common arm 7 is formed in a roughly triangular shape when viewed in the upper and lower direction. However, the common arm 7 may be formed in a polygonal shape except a roughly triangular shape or in an "L"-shape when viewed in the upper and lower direction.

In the embodiment described above, the robot 1 is a so-called atmosphere robot which is used in the atmosphere but the robot 1 may be a so-called vacuum robot which is used in the vacuum state. In other words, the robot to which the structure of the present invention is applied is not limited to the atmosphere robot. Further, in the embodiment described above, an object which is conveyed by the robot 1 is a wafer 2 formed in a disk-like shape but an object which is conveyed by the robot 1 may be a plate formed in a disk-like shape except the wafer 2 or may be a plate or the like which is formed in a polygonal shape such as a rectangular shape.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for performing carrying-out of a plurality of objects to be conveyed from a storage part in which the objects to be conveyed are accommodated and carrying-in of the objects to be conveyed to the storage part, the industrial robot comprising:
a first hand and a second hand, each of which being structured to mount or temporarily hold the objects to be conveyed;
a first arm which turnably holds the first hand on a first end side, and a second arm which turnably holds the second hand on a first end side;
a common arm which turnably holds a second end side of the first arm and a second end side of the second arm;
a first turning center part which is a turning center of the first arm with respect to the common arm, and a second turning center part which is a turning center of the second arm with respect to the common arm; and
a main body part which turnably holds the common arm such that the main body part is turnable around a turning center of the main body part;
wherein in a waiting state of the first hand and the second hand where the first arm and the second arm are contracted with respect to the main body part, the first hand and the second hand are disposed so as to superpose each other, and the first hand and the second hand are formed with an escape part for preventing interference with the first turning center part and the second turning center part at a time of a turning operation;
wherein the turning center of the main body part, the turning center of the first arm with respect to the common arm, and the turning center of the second arm with respect to the common arm form a triangle;
the first hand and the second hand are each provided with a first mounting part and a second mounting part each structured to mount different objects of the plurality of objects to be conveyed, and a fixing part to which a base end side of the first mounting part and a base end side of the second mounting part are fixed; and
wherein the industrial robot is structured such that when one of the first arm/first hand and second arm/second hand is extended or contracted, the other of the first arm/first hand and second arm/second hand that is not extended or contracted is turned together with the common arm such that a position of the other of the first arm/first hand and second arm/second hand that is not extended or contracted does not change with respect to the common arm.

2. The industrial robot according to claim 1, wherein
the common arm is formed in a roughly triangular shape when viewed in an axial direction of a turning center of the first arm or the second arm with respect to the common arm, and
the first turning center part and the second turning center part are respectively disposed in vicinities of different angular parts of the common arm.

3. The industrial robot according to claim 1, wherein the first hand and the second hand are closely faced to each other in the waiting state.

4. The industrial robot according to claim 1, wherein
the first mounting part and the second mounting part are fixed to the fixing part in a separated state with a predetermined distance in an orthogonal direction which is perpendicular to a conveying direction of the objects to be conveyed, and
the escape part is formed on outer sides of the first mounting part and the second mounting part in the orthogonal direction.

5. The industrial robot according to claim 4, wherein the escape part comprises:
a circular arc part that curves toward the outer side in the orthogonal direction when viewed from the base end of the mounting part to a tip end of the mounting part;
an inclined part connected to the circular arc part, the inclined part inclining toward the outer side in the orthogonal direction when viewed from the base end of the mounting part to the tip end of the mounting part.

6. An industrial robot for performing carrying-out of a plurality of objects to be conveyed from a storage part in which the objects to be conveyed are accommodated and carrying-in of the objects to be conveyed to the storage part, the industrial robot comprising:
a first hand and a second hand, each of which being structured to mount or temporarily hold the objects to be conveyed;
a first arm which turnably holds the first hand on a first end side, and a second arm which turnably holds the second hand on a first end side;
a common arm which turnably holds a second end side of the first arm and a second end side of the second arm;
a first turning center part which is a turning center of the first arm with respect to the common arm, and a second turning center part which is a turning center of the second arm with respect to the common arm; and a main body part which turnably holds the common arm such that the main body part is turnable around a turning center of the main body part;

wherein in a waiting state of the first hand and the second hand where the first arm and the second arm are contracted with respect to the main body part, the first hand and the second hand are disposed so as to superpose each other from an upper side in this order and, the second hand is formed with an escape part for preventing interference with the first turning center part at a time of a turning operation;

wherein the turning center of the main body part, the turning center of the first arm with respect to the common arm, and the turning center of the second arm with respect to the common arm form a triangle;

the first hand and the second hand are each provided with a first mounting part and a second mounting part each structured to mount different objects of the plurality of objects to be conveyed, and a fixing part to which a base end side of the first mounting part and a base end side of the second mounting part are fixed;

wherein the industrial robot is structured such that when one of the first arm/first hand and second arm/second hand is extended or contracted, the other of the first arm/first hand and second arm/second hand that is not extended or contracted is turned together with the common arm such that a position of the other of the first arm/first hand and second arm/second hand that is not extended or contracted does not change with respect to the common arm.

7. The industrial robot according to claim 6, wherein the first mounting part and the second mounting part are fixed to the fixing part in a separated state with a predetermined distance in an orthogonal direction which is perpendicular to a conveying direction of the objects to be conveyed, and the escape part is formed on outer sides of the first mounting part and the second mounting part in the orthogonal direction.

8. The industrial robot according to claim 7, wherein the escape part comprises:

a circular arc part that curves toward the outer side in the orthogonal direction when viewed from the base end of the mounting part to a tip end of the mounting part;

an inclined part connected to the circular arc part, the inclined part inclining toward the outer side in the orthogonal direction when viewed from the base end of the mounting part to the tip end of the mounting part.

* * * * *